(12) United States Patent
Pecha et al.

(10) Patent No.: US 11,335,426 B2
(45) Date of Patent: May 17, 2022

(54) TARGETED TEST FAIL INJECTION

(71) Applicant: Micron Technology, Inc., Boise, ID (US)

(72) Inventors: Brian Thomas Pecha, Boise, ID (US); Brent Thomas Groulik, Boise, ID (US); Nicholas Kenley Copic, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 17/073,126

(22) Filed: Oct. 16, 2020

(65) Prior Publication Data

US 2022/0122684 A1   Apr. 21, 2022

(51) Int. Cl.
*G11C 29/36* (2006.01)
*G11C 29/50* (2006.01)

(52) U.S. Cl.
CPC .................................. *G11C 29/36* (2013.01)

(58) Field of Classification Search
None
See application file for complete search history.

(56) References Cited

U.S. PATENT DOCUMENTS

| | | | | |
|---|---|---|---|---|
| 5,132,685 A * | 7/1992 | DeWitt | .......... | G01R 31/318502 324/73.1 |
| 2001/0048609 A1* | 12/2001 | Hikida | ............... | G11C 16/3468 365/185.2 |
| 2005/0146981 A1* | 7/2005 | Ahn | ........................ | G11C 29/48 365/189.05 |
| 2005/0190618 A1* | 9/2005 | Kikutake | ............. | G11C 29/787 365/200 |
| 2005/0229052 A1* | 10/2005 | Brahmadathan | .... | G06F 11/1032 714/724 |
| 2007/0250745 A1* | 10/2007 | Schneider | ............... | G11C 29/44 714/718 |
| 2010/0251043 A1* | 9/2010 | Anzou | ............. | G11C 29/50012 714/719 |
| 2015/0127998 A1* | 5/2015 | Veggetti | ................. | G11C 29/48 714/718 |
| 2017/0148529 A1* | 5/2017 | Kim | ........................ | G11C 29/76 |
| 2018/0348838 A1* | 12/2018 | Cox | ....................... | G06F 3/0634 |

OTHER PUBLICATIONS

Wang et al., An automatic design for flash memory testing, IEEE, Conference Paper, pp. 46-49 (Year: 2007).*

* cited by examiner

*Primary Examiner* — Cynthia Britt
*Assistant Examiner* — Dipakkumar B Gandhi
(74) *Attorney, Agent, or Firm* — Holland & Hart LLP

(57) ABSTRACT

Methods, systems, and devices for targeted test fail injection are described. A memory device may include self-test circuitry configured to test one or more memory cells of a memory array. The self-test circuitry may be configured to store one or more addresses to fail during a test of the memory array based on an indication from a mode register of the memory device. The self-test circuitry may be configured to fail the stored one or more addresses regardless of the outcome of the test at the one or more memory addresses. For example, when an accessed address matches a stored address during test, the self-test circuitry may generate an indication that the accessed address has failed one or more tests of the self-test procedure. Based on the self-test circuitry failing the stored addresses, a test of the memory array may be validated.

19 Claims, 6 Drawing Sheets

TARGETED TEST FAIL INJECTION

FIELD OF TECHNOLOGY

The following relates generally to one or more systems for memory and more specifically to targeted test fail injection.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Some memory devices may include self-test circuitry, such as memory built-in self-test (MBIST) circuitry, that may enable the memory device to perform self-test procedures to identify or repair defects in a memory device. In some examples, self-test circuitry may be configured to generate test vectors and memory addressing sequences for testing the memory array. The self-test circuitry may be configured to step through a sequence of instructions for writing test vector values to a memory array, reading the values back from the memory array, and determining whether the memory array is faulty (e.g., whether it includes one or more errors) based on whether the values read from the memory array correspond to the values written to the memory array.

In some cases, it may be beneficial to validate or verify that the self-test circuitry operates as configured. For example, if the self-test circuitry is not validated, a self-test procedure that identifies no defects in the memory device may indicate that the memory array includes no errors, or the result of the self-test procedure may indicate that the self-test procedure is faulty (e.g., the self-test circuitry may include one or more errors or defects).

According to the techniques described herein, a memory device may include self-test circuitry configured to fail one or more addresses of a memory array intentionally during a test procedure. The self-test circuitry may store the one or more addresses based on an indication from a mode register of the memory device. The self-test circuitry may be configured to fail the stored addresses regardless of the data (e.g., values) written at the stored addresses. For example, when a self-test procedure is performed on the memory array, the addresses accessed may be compared with the stored addresses. When an accessed address matches a stored address, the self-test circuitry may generate an indication that the accessed address has failed one or more tests of the self-test procedure based on the comparison. In some examples, the self-test circuitry may be configured to perform a repair operation at addresses identified in the generated indication. Based on the self-test circuitry failing the stored addresses, the test procedure and/or the self-test circuitry may be validated.

Features of the disclosure are initially described in the context of systems and dies as described with reference to FIGS. 1 and 2. Features of the disclosure are described in the context of a block diagram and a process flow as described with reference to FIGS. 3 and 4. These and other features of the disclosure are further illustrated by and described with reference to an apparatus diagram and a flowchart that relate to targeted test fail injection as described with reference to FIGS. 5 and 6.

Figure 1:
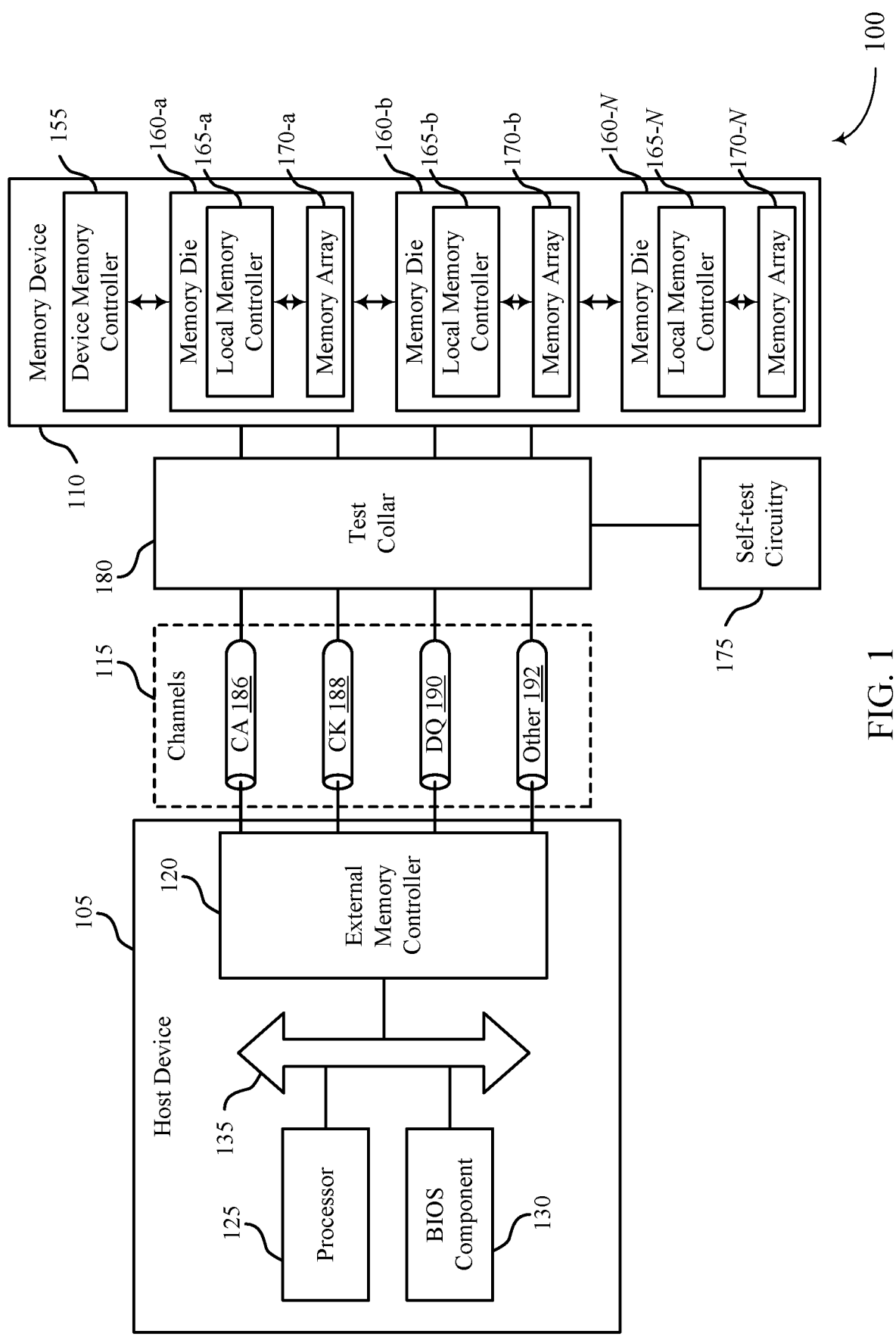
FIGS. 1 and 2 illustrate examples of systems that support targeted test fail injection in accordance with examples as disclosed herein.

FIG. 1 illustrates an example of a system 100 that supports targeted test fail injection in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, the system 100 may include self-test circuitry 175 and a test collar 180. The self-test circuitry 175 may be configured to perform a self-test procedure on memory device 110 to detect defects, faults, or errors in memory device 110. A test collar 180 may be configured used to cause the memory device 110 to communicate with the self-test circuitry 175 during test mode and to communicate with the host device 105 during a normal mode. The test collar 180 may be coupled with the channels 115.

According to the techniques described herein, the self-test circuitry 175 may be configured to store one or more addresses of a memory array 170, for example based on an indication from a mode register of the memory device 110. The self-test circuitry 175 may be configured to fail the stored addresses regardless of the data (e.g., values) written at the stored addresses. For example, when a self-test procedure is performed on the memory array 170, the addresses accessed may be compared to the stored addresses at the self-test circuitry 175. When an accessed address matches a stored address, the self-test circuitry 175 may generate an indication that the accessed address has failed one or more tests of the self-test procedure based on the comparison. In some examples, the self-test circuitry 175 may be configured to perform a repair operation on the memory array 170 at addresses identified in the generated indication. Based on the self-test circuitry 175 failing the stored addresses, a user of the memory device 110 or the host device 105 may verify or validate operation of the self-test circuitry 175.

The system 100 may include one or more registers accessible by both the host device 105 and the memory device 110. The one or more registers may include one or more mode registers and one or more other registers. In some examples, the one or more mode registers may be configured to store an indication of whether an address is forced to fail one or more tests applied to the memory array and/or an indication that a test procedure is to start. In some examples, the one or more mode registers may store the one or more memory addresses that are to fail. In some examples, the one or more other registers may store the one or more memory addresses that are to fail. The host device 105 may be configured to write a value to the one or more registers. In some cases, the host device 105 may write an indication to the one or more mode registers using a load mode register command. The memory device 110 may read the mode registers and perform procedures accordingly. In some cases, the host device 105 may write the one or more addresses that are to fail as part of an activate command.

Figure 2:
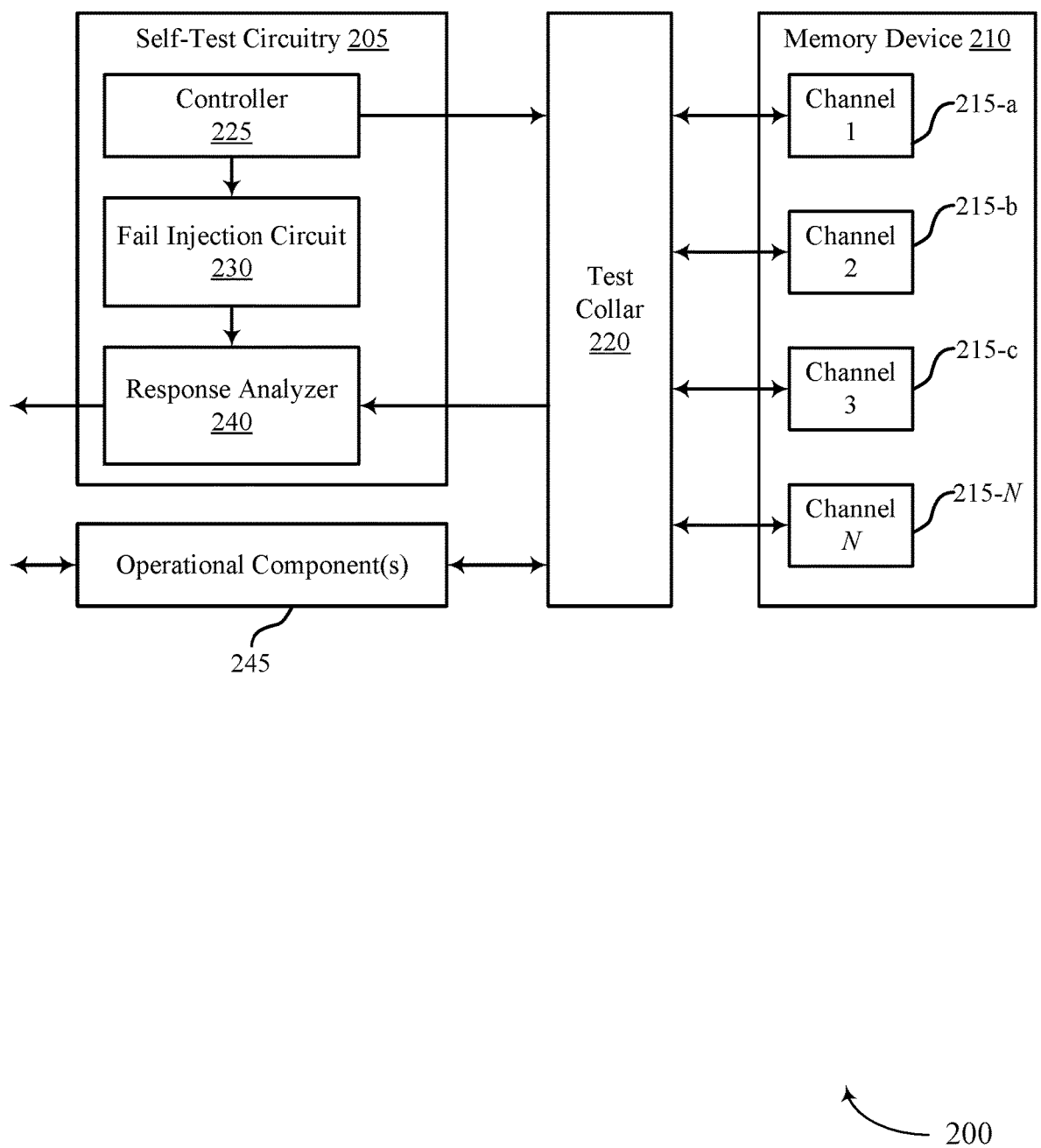

FIG. 2 illustrates an example of a system 200 that supports targeted test fail injection in accordance with examples as disclosed herein. The system 200 may be an example of the system 100 described with reference to FIG. 1. The system 200 may include self-test circuitry 205 and a memory device 210. The memory device 210 may be an example of the memory device 110 described with reference to FIG. 1. The memory device 210 may include or may be coupled with a set of channels 215 (e.g., channels 215-*a*, 215-*b*, 215-*c*, and 215-*d*) for communicating information, for example with the self-test circuitry 205, with a host device, with another device, or any combination thereof. The self-test circuitry 205 may be an example of the self-test circuitry 175 described with reference to FIG. 1. In some examples, the self-test circuitry 205 may include a sequencer coupled with a controller 225, a fail injection circuit 230, and a response analyzer 240. The sequencer may be configured to receive one or more commands from the controller 225 and generate one or more signals to initiate the fail injection circuit 230.

The self-test circuitry 205 may be configured to perform a self-test procedure on the memory device 210 to detect defects, faults, or errors in the memory device 210. For example, the self-test circuitry 205 may be configured to use one or more verification algorithms to check for errors in the memory device 210, such as a March algorithm, checkerboard algorithm, or another algorithm, or a combination thereof. The verification algorithm may, for example, be executed by the self-test circuitry 205 to write values to memory cells in the memory device 210, read the values from the memory cells, and determine whether the values read from the memory cells match the values written to the memory cells. Such verification algorithms may be used to detect various faults in one or more memory arrays of the memory device 210, such as stuck-at faults (in which the state of a memory cell is "stuck" at a particular value), transition faults (in which a memory cell fails to transition from a 0 to a 1, or vice versa), and coupling faults (in which writing a value to one memory cell affects the value of a nearby memory cell).

In some examples, the system 200 may include a test collar 220 that may be used to switch the memory device 210 between communicating with the self-test circuitry 205 and communicating with the host device as part of a standard operating mode of the memory device 210. For example, the test collar 220 may couple the memory device 210 with one or more operational components 245 (e.g., the host device) during normal operation, and may couple the memory device 210 with the self-test circuitry 205 during a self-test procedure. In some examples, the test collar 220 may be configured to receive a signal from an external controller, such as from the host device, and may couple the memory device 210 with the self-test circuitry 205 or with another device based on the signal. The test collar 220 may be an example of the test collar 180 described with reference to FIG. 1.

The self-test circuitry 205 may be configured to implement one or more tests on the memory device 210. In some examples, the controller 225 may be configured to initiate a self-test procedure. The controller 225 may generate and output one or more patterns for performing a verification algorithm on the memory device 210. Such patterns may include memory access instructions, test vectors (e.g., a set of logic states to be written to the memory device 210), memory address sequences, or a combination of these for performing the verification algorithm. In some examples, the controller 225 may include an address generator for generating the memory addresses. In some examples, the controller 225 may include a counter-based circuit or a linear feedback shift register for generating the test vectors.

In some examples, the self-test circuitry 205 may validate or verify operation of the self-test circuitry 205 in the self-test procedure using the fail injection circuit 230 and the response analyzer 240. The controller 225 may configure the fail injection circuit to store one or more addresses of the memory device 210, for example based on an indication from a mode register of the memory device 210. The response analyzer 240 may be coupled with the fail injection circuit 230 and with the memory device 210. The response analyzer 240 may receive data that is output by the memory device 210 (e.g., in response to a read instruction) during the self-test procedure. The response analyzer 240 may compare the address of the received data with the addresses stored at the fail injection circuit 230. When an address matches a stored address, the response analyzer 240 may generate a failure indication (which may be referred to as a "fail") for the address regardless of the received data.

The response analyzer 240 may output an indication of whether the memory device 210 includes one or more errors, which may include the fails generated based on input from the fail injection circuit 230. In some cases, the response analyzer 240 may be referred to as an output response analyzer. In some cases, the response analyzer 240 may include one or more comparators or other supporting circuitry. In some cases, the output of the response analyzer 240 may cause the memory array to be repaired based on the presence of one or more errors. For example, a faulty conductive line may be replaced using a redundant line built into the memory array. The response analyzer 240 or the host device may cause such repairs to occur based on the output of the response analyzer 240. In some examples, based on the response analyzer 240 reporting fails for the addresses stored at the fail injection circuit 230, a user of the memory device 210, the operational components 245, or the host device may verify or validate operation of the self-test circuitry 205.

Figure 3:
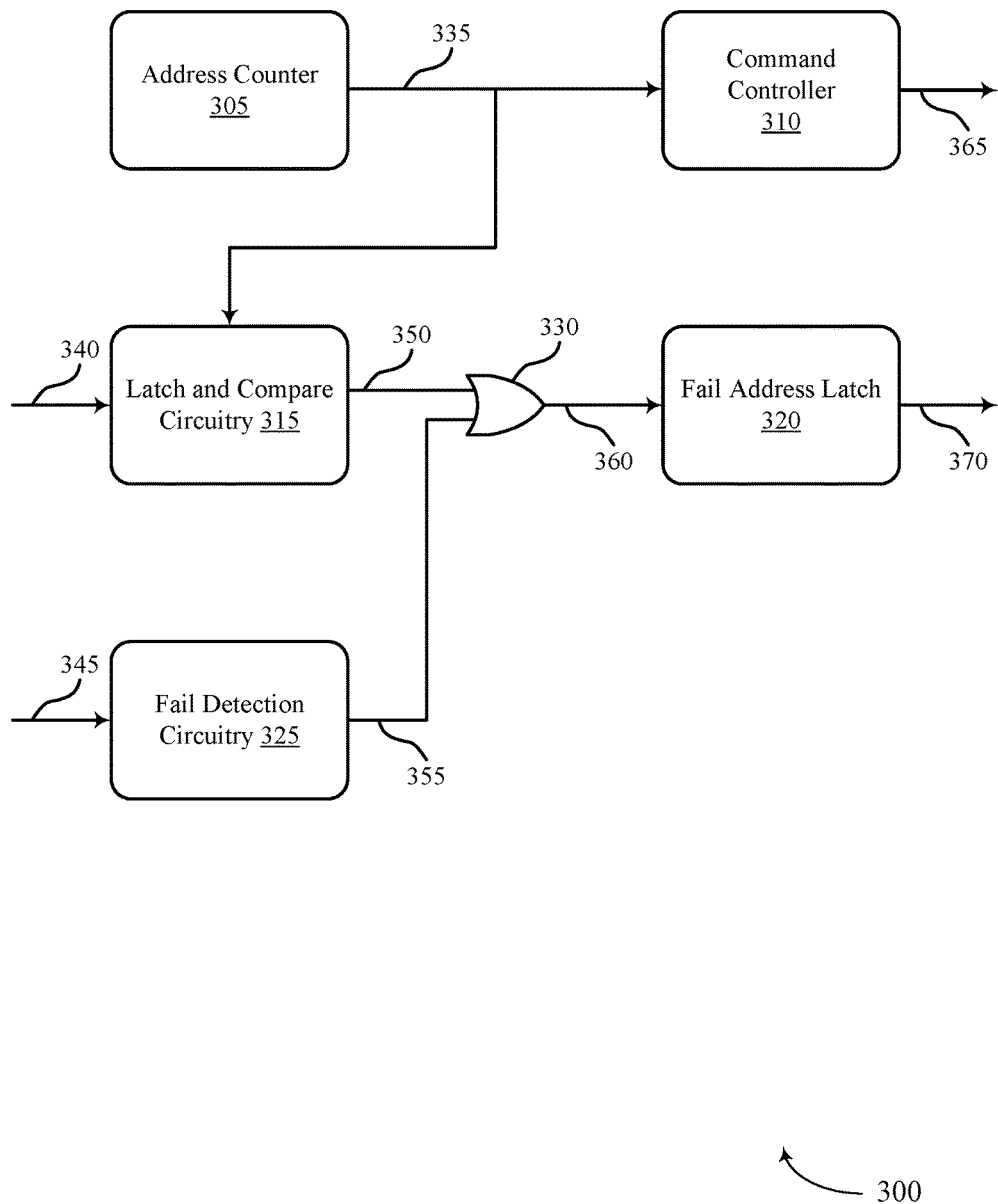
FIG. 3 illustrates an example of a block diagram that supports targeted test fail injection in accordance with examples as disclosed herein.

FIG. 3 illustrates an example of a block diagram 300 that supports targeted test fail injection in accordance with examples as disclosed herein. In some examples, the components illustrated in the block diagram 300 may be included in self-test circuitry of a memory device, such as the self-test circuitry 175 or the self-test circuitry 205 described with reference to FIGS. 1 and 2.

The self-test circuitry may be configured to perform a self-test procedure on the memory device to detect defects, faults, or errors in the memory device. For example, the self-test circuitry may write values to memory cells in a memory array of the memory device, read the values from the memory cells, and determine whether the values read from the memory cells match the values written to the memory cells. An address counter 305 may generate an address 335 of a memory cell to be tested in the self-test procedure. The address 335 may be input at a command controller 310, which may determine (e.g., based on a verification algorithm associated with the self-test procedure) an operation (e.g., read, write, modify, or any combination thereof) to perform on the memory cell corresponding to the address 335. The command controller 310 may indicate in a command 365 the determined operation to be performed at the address 335.

Based on the command 365, the self-test circuitry may receive data 345 from the memory array, where the data 345 may correspond to the address 335. Fail detection circuitry 325 may compare the received data 345 to expected data based on the command 365 and determine whether an error exists in the data 345. The fail detection circuitry 325 may output a fail indication 355 based on the comparison. The fail indication 355 may include a value indicating whether an error exists (e.g., a "1" may indicate an error exists and a "0" may indicate that no error exists). Based on the fail indication 355, a fail address latch 320 may receive a fail flag 360 indicating whether an error exists at the address 335. Based on the fail flag 360, the fail address latch 320 may output a fail address, which may output an indication 370 of whether the memory device includes one or more errors. In some cases, the indication 370 may cause the memory array to be repaired based on the presence of one or more errors.

In some cases, it may be beneficial to validate or verify that the self-test circuitry of the block diagram 300 operates as configured. For example, if the self-test circuitry is not validated, an indication 370 that identifies no defects in the memory device may indicate that the memory array includes no errors, or the absence of identified errors may indicate that one or more components of the block diagram 300 are faulty and fail to detect errors that are present in the memory array.

In some cases, a user may validate the self-test circuitry by performing self-test procedures on memory arrays with known defects to verify that the self-test circuitry accurately identifies the defects. However, this technique may include a relatively large quantity of materials for testing a variety of fail modes to validate some or all portions of the self-test circuitry.

According to the techniques described herein, the self-test circuitry may include latch and compare circuitry 315 configured to store (e.g., latch) one or more addresses of a memory array. The latch and compare circuitry 315 may receive a fail injection indication 340, for example from a mode register of the memory device. Based on the fail injection indication 340, the latch and compare circuitry 315 may be configured to fail the stored addresses regardless of the data written at the stored addresses. In some examples, the fail injection indication 340 may include a value indicating whether the stored addresses should be failed. For example, a "1" may indicate that the latch and compare circuitry 315 is to fail the stored addresses and a "0" may indicate that that the latch and compare circuitry 315 is to be disabled.

In an example, the address 335 output by the address counter 305 may be input to the latch and compare circuitry 315. If the address 335 matches a stored address at the latch and compare circuitry 315, the latch and compare circuitry 315 may output a force fail indication 350 (which may be referred to as a fail pulse) that includes a value (e.g., a "1") indicating that the address 335 is to be failed regardless of the data 345. In some examples, the force fail indication 350 and the fail indication 355 may act as inputs for a logic OR gate 330, and the OR gate 330 may output the fail flag 360. Based on the self-test circuitry failing the stored addresses, a user of the memory device may verify or validate operation of the self-test circuitry. For example, the user may verify that the address 335 was failed based on the force fail indication by identifying a repair operation performed at the address 335 according to the indication 370.

Figure 4:
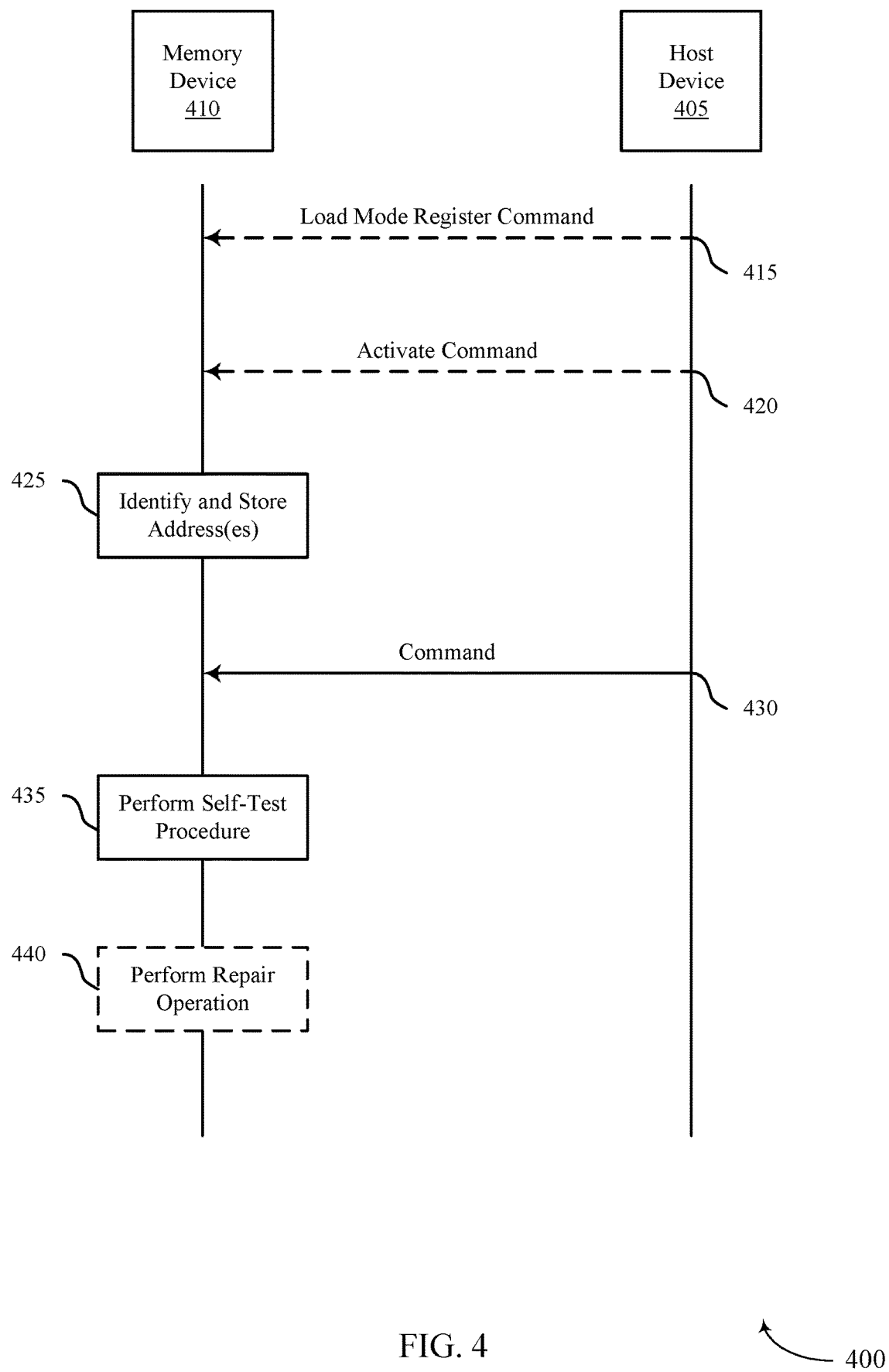
FIG. 4 illustrates an example of a process flow that supports targeted test fail injection in accordance with examples as disclosed herein.

FIG. 4 illustrates an example of a process flow 400 that supports targeted test fail injection in accordance with examples as disclosed herein. In some examples, the process flow 400 may illustrate implementation of aspects of the systems 100 and 200 as described with reference to FIGS. 1 and 2. For example, the process flow 400 may include example transmissions or operations associated with one or more of a host device 405 and a memory device 410, which may be examples of the corresponding devices described with reference to FIGS. 1 and 2. In the following description of the process flow 400, the transmissions between the host device 405 and the memory device 410 may be transmitted in a different order than the example order shown, or the operations performed by the host device 405 and the memory device 410 may be performed in different orders or at different times. Some transmissions or operations may also be omitted from the process flow 400, and other transmissions or operations may be added to the process flow 400. The transmissions and operations performed by the host device 405 and the memory device 410 may support improvement to the memory device 410 operations and, in some examples, may promote improvements to the memory device 410 reliability, among other benefits.

In some examples, at 415 the memory device 410 may receive a load mode register command. The load mode register command may indicate that self-test circuitry at the memory device 410 is to inject fails to verify or validate operation of the self-test circuitry during a self-test procedure. In some examples, at 420 the memory device 410 may receive an activate command to store one or more addresses of a memory array of the memory device 410, for example in a mode register of the self-test circuitry.

At 425, the memory device 410 may identify and store the one or more addresses, for example based on the load mode register command and the activate command. For example, the memory device 410 may identify a value (e.g., a "1") of an indication in the load mode register command. The memory device 410 may store (e.g., latch) the one or more addresses in the self-test circuitry or in a register. In some examples, the memory device 410 may refrain from activating access lines (e.g., word lines, digit lines, or both) associated with the one or more addresses based on receiving the activate command based on the indication stored in the mode register. In some examples, the memory device may store the indication in the mode register.

At 430, the memory device 410 may receive a command to perform a self-test procedure on the memory array, for example using one or more tests. In some examples, the command may be a second load mode register command. In some examples, the memory device 410 may identify a value of an indication in the command, where the value may indicate the self-test circuitry is to perform the self-test procedure on the memory array. The indication in the command may be stored in a second mode register of the memory device 410.

At 435, the memory device 410 may perform the self-test procedure on the memory array, for example using the self-test circuitry. The memory device 410 may perform the self-test procedure based on receiving the command (e.g., the second load mode register command). In some examples, an address accessed during the self-test procedure may be compared to the stored one or more addresses. When an accessed address matches a stored address, the self-test circuitry may generate an indication that the accessed address has failed one or more tests of the self-test procedure based on the comparison, regardless of the data (e.g., values) written at the accessed address.

In some examples, at 440 the memory device 410 may perform a repair operation on the memory array at addresses indicated in the generated indication. A user of the memory device 410 or the host device 405 may verify or validate operation of the self-test circuitry at the memory device 410 based on identifying the repair operation performed at the indicated addresses.

Figure 5:
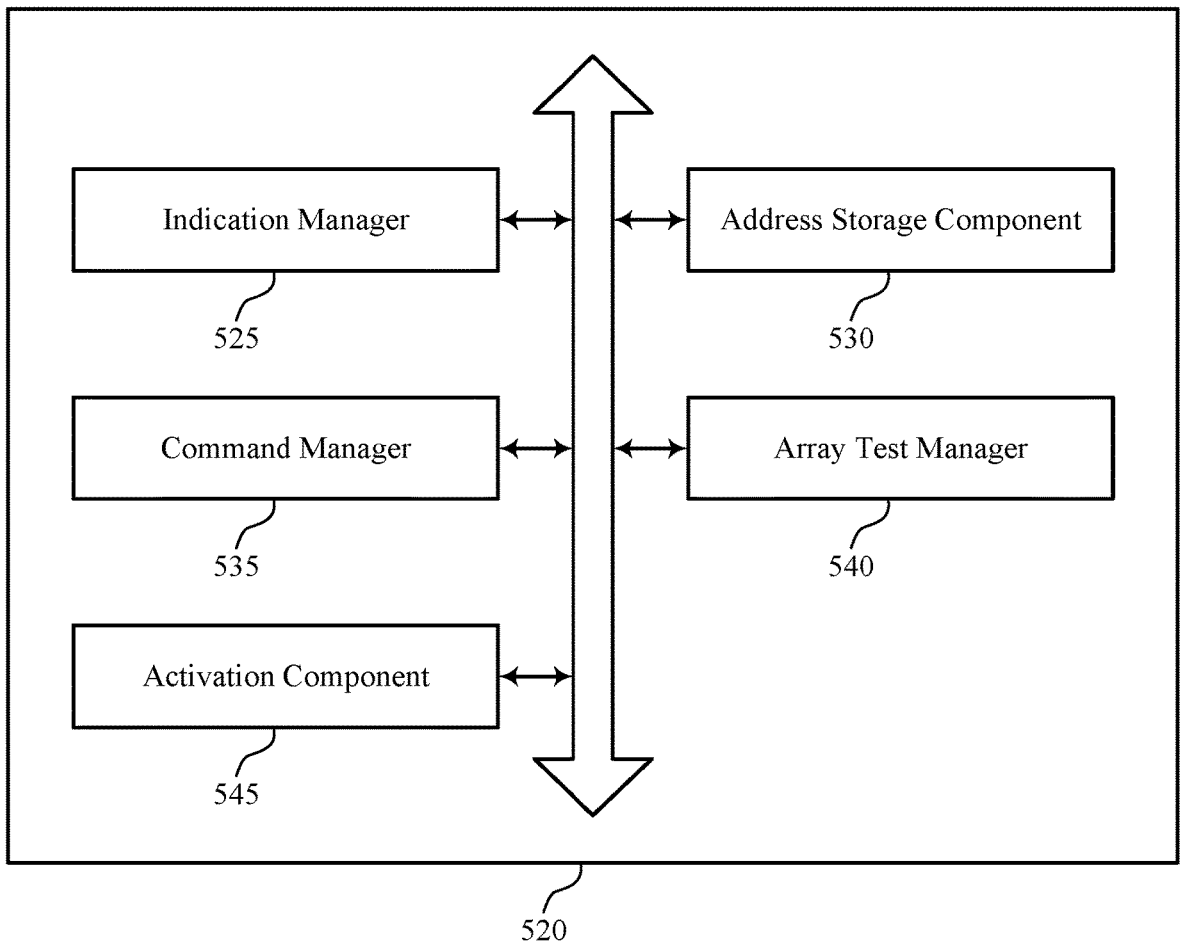
FIG. 5 shows a block diagram of a memory device that supports targeted test fail injection in accordance with examples as disclosed herein.

FIG. 5 shows a block diagram 500 of a memory device 520 that supports targeted test fail injection in accordance with examples as disclosed herein. The memory device 520 may be an example of aspects of a memory device as described with reference to FIGS. 1 through 4. The memory device 520, or various components thereof, may be an example of means for performing various aspects of targeted test fail injection as described herein. For example, the memory device 520 may include an indication manager 525, an address storage component 530, a command manager 535, an array test manager 540, an activation component 545, or any combination thereof. Each of these components may communicate, directly or indirectly, with one another (e.g., via one or more buses).

The indication manager 525 may be configured to provide or support a means for identifying a value of an indication of whether an address is forced to fail one or more tests applied to a memory device. The address storage component 530 may be configured to provide or support a means for storing the address of a memory array of the memory device based at least in part on identifying the value of the indication. The command manager 535 may be configured to provide or support a means for receiving a command to perform a test on the memory array based at least in part on storing the address. The array test manager 540 may be configured to provide or support a means for determining, as part of the test, that the address includes one or more errors based at least in part on the value of the indication and storing the address.

In some examples, the command manager 535 may be configured to provide or support a means for transmitting a second command to perform a repair operation on the memory array based at least in part on determining that the address includes the one or more errors.

In some examples, the command manager 535 may be configured to provide or support a means for receiving an activate command to store the address in a mode register of a test circuit of the memory device, where the address is stored in the mode register based at least in part on receiving the activate command. In some examples, the activation component 545 may be configured to provide or support a means for refraining from activating an access line of the memory device based at least in part on receiving the activate command.

In some examples, to support receiving the command to perform the test on the memory array, the indication manager 525 may be configured to provide or support a means for identifying a second value of a second indication of whether the test is performed on the memory array.

In some examples, the indication is stored in a first mode register. In some examples, the second indication is stored in a second mode register.

In some examples, the value of the indication is stored in the first mode register using a first load mode register command. In some examples, the second value of the second indication is stored in the second mode register using a second load mode register command.

In some examples, the indication manager 525 may be configured to provide or support a means for transmitting a second indication to a test circuit indicating the test circuit is to perform the test on the memory array, the indication based at least in part on the value of the indication.

In some examples, the value of the indication is identified based at least in part on a load mode register command.

Figure 6:
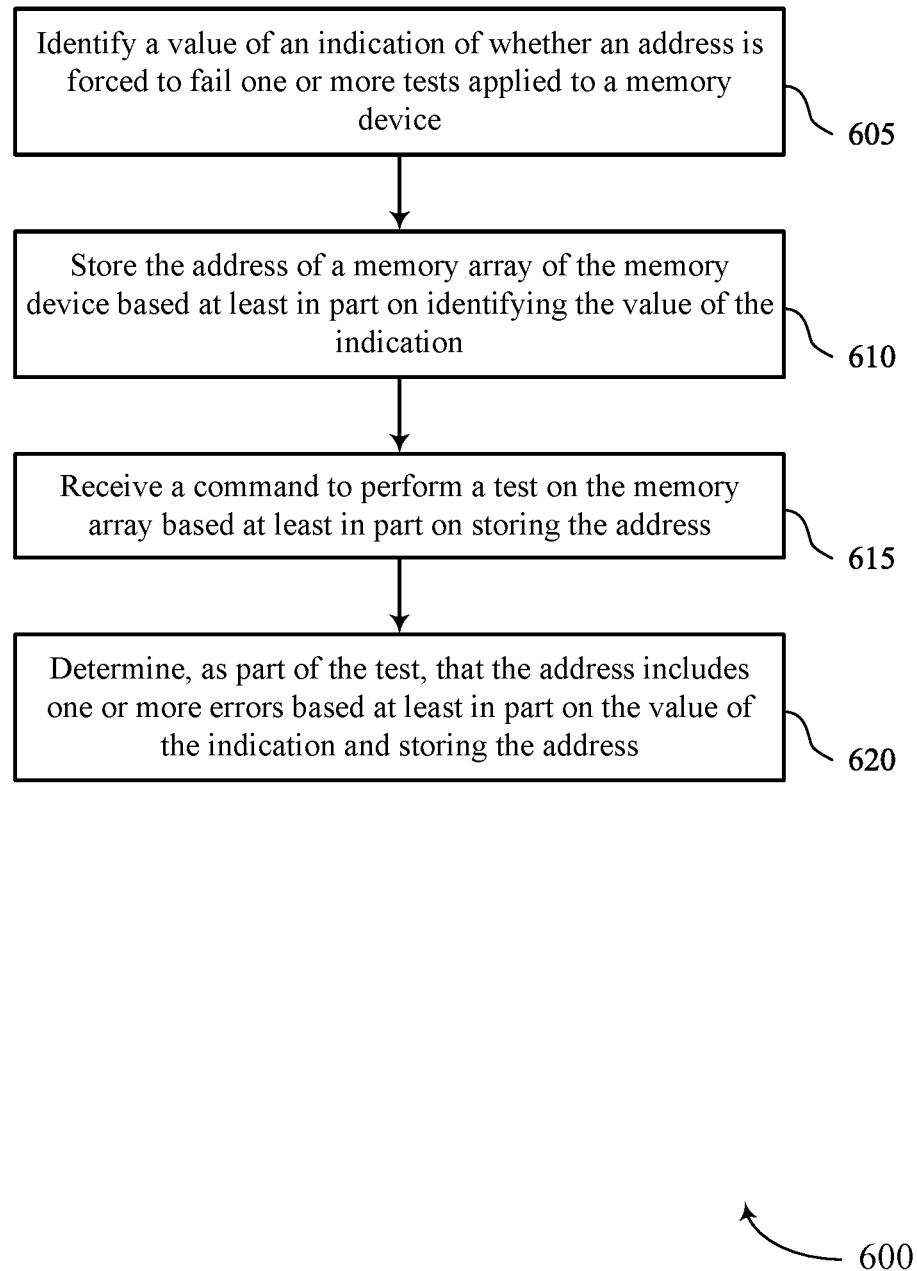
FIG. 6 shows a flowchart illustrating a method or methods that support targeted test fail injection in accordance with examples as disclosed herein.

FIG. 6 shows a flowchart illustrating a method 600 that supports targeted test fail injection in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include identifying a value of an indication of whether an address is forced to fail one or more tests applied to a memory device. The operations of 605 may be performed according to the methods described herein. In some examples, aspects of the operations of 605 may be performed by an indication manager 525 as described with reference to FIG. 5.

At 610, the method may include storing the address of a memory array of the memory device based at least in part on identifying the value of the indication. The operations of 610 may be performed according to the methods described herein. In some examples, aspects of the operations of 610 may be performed by an address storage component 530 as described with reference to FIG. 5.

At 615, the method may include receiving a command to perform a test on the memory array based at least in part on storing the address. The operations of 615 may be performed according to the methods described herein. In some examples, aspects of the operations of 615 may be performed by a command manager 535 as described with reference to FIG. 5.

At 620, the method may include determining, as part of the test, that the address includes one or more errors based at least in part on the value of the indication and storing the address. The operations of 620 may be performed according to the methods described herein. In some examples, aspects of the operations of 620 may be performed by an array test manager 540 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for identifying a value of an indication of whether an address is forced to fail one or more tests applied to a memory device, storing the address of a memory array of the memory device based at least in part on identifying the value of the indication, receiving a command to perform a test on the memory array based at least in part on storing the address, and determining, as part of the test, that the address includes one or more errors based at least in part on the value of the indication and storing the address.

Some examples of the method 600 and the apparatus described herein may further include operations, features, circuitry, logic, means, or instructions for transmitting a second command to perform a repair operation on the memory array based at least in part on determining that the address includes the one or more errors.

Some examples of the method 600 and the apparatus described herein may further include operations, features, circuitry, logic, means, or instructions for receiving an activate command to store the address in a mode register of a test circuit of the memory device, where the address may be stored in the mode register based at least in part on receiving the activate command and refraining from activating an access line of the memory device based at least in part on receiving the activate command.

In some examples of the method 600 and the apparatus described herein, identifying a second value of a second indication of whether the test may be performed on the memory array.

In some examples of the method 600 and the apparatus described herein, the indication may be stored in a first mode register and the second indication may be stored in a second mode register.

In some examples of the method 600 and the apparatus described herein, the value of the indication may be stored in the first mode register using a first load mode register command and the second value of the second indication may be stored in the second mode register using a second load mode register command.

Some examples of the method 600 and the apparatus described herein may further include operations, features, circuitry, logic, means, or instructions for transmitting a second indication to a test circuit indicating the test circuit may be to perform the test on the memory array, the indication based at least in part on the value of the indication.

In some examples of the method 600 and the apparatus described herein, the value of the indication may be identified based at least in part on a load mode register command.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array, a mode register configured to store an indication of whether an address is forced to fail one or more tests applied to the memory array, and a test circuit configured to perform the one or more tests on the memory array, the test circuit including a first circuit configured to identify the address that is forced to fail the one or more tests of the memory array and a second circuit configured to perform a test on the memory array and fail the address based on the indication stored in the mode register In some examples of the apparatus, the first circuit includes a register configured to store the address that may be forced to fail.

In some examples of the apparatus, the first circuit includes logic configured to receive a first input indicating whether the address may be forced to fail and a second input indicating whether the address includes one or more errors and to generate a flag that the address fails the one or more tests based on the first input or the second input.

In some examples of the apparatus, the second mode register stores the address based on the mode register storing the indication.

In some examples of the apparatus, the second circuit performs the test based on the register storing the address.

In some examples of the apparatus, the indication indicates whether one or more addresses may be forced to fail the one or more tests applied to the memory array, the one or more addresses including the address and the second circuit may be further configured to fail the one or more addresses based on the indication stored in the mode register.

In some examples of the apparatus, the second circuit may be further configured to perform a repair operation based on failing the address.

In some examples of the apparatus, the second circuit may be further configured to fail the address based on the indication stored in the mode register.

In some examples of the apparatus, the test circuit may be further configured to cause the apparatus to reset the indication after the second circuit of the test circuit may have performed the test.

In some examples of the apparatus, the mode register may be further configured to store the indication based on a load mode register command.

Another apparatus is described. The apparatus may include a memory array and a controller coupled with the memory array and operable to cause the apparatus to identify a value of an indication of whether an address is forced to fail one or more tests applied to the memory array, store the address of the memory array based on identifying the value of the indication, receive a command to perform a test on the memory array based on storing the address, and determine, as part of the test, that the address includes one or more errors based on the value of the indication and storing the address In some examples, the apparatus may include a test circuit configured to perform the one or more tests on the memory array, where the controller may be further operable to cause the apparatus to receive a load mode register command, where the value of the indication is identified based on receiving the load mode register command, and receive an activate command to store the address in a register of the test circuit, where the address is stored in the register based on receiving the activate command.

In some examples of the apparatus, the controller may be further operable to cause the apparatus to identify a second value of a second indication of whether the test may be performed on the memory array, where receiving the command to perform the test on the memory array may be based on identifying the second value.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein

What is claimed is:

1. An apparatus, comprising:
   a memory array;
   a mode register configured to store an indication of whether an address is forced to fail one or more tests applied to the memory array; and
   a test circuit configured to perform the one or more tests on the memory array, the test circuit comprising:
   a first circuit comprising a register configured to store the address that is forced to fail based at least in part on the indication of whether the address is forced to fail the one or more tests, the first circuit configured to identify the address that is forced to fail the one or more tests of the memory array; and
   a second circuit configured to perform a test on the memory array and fail the address based at least in part on the indication stored in the mode register.

2. The apparatus of claim 1, wherein the first circuit comprises:
  logic configured to receive a first input indicating whether the address is forced to fail and a second input indicating whether the address includes one or more errors and to generate a flag that the address fails the one or more tests based at least in part on the first input or the second input.

3. The apparatus of claim 1, wherein the register stores the address that is forced to fail based at least in part on the mode register storing the indication.

4. The apparatus of claim 3, wherein the second circuit performs the test based at least in part on the register storing the address.

5. The apparatus of claim 1, wherein:
  the indication indicates whether one or more addresses are forced to fail the one or more tests applied to the memory array, the one or more addresses comprising the address; and
  the second circuit is further configured to fail the one or more addresses based at least in part on the indication stored in the mode register.

6. The apparatus of claim 1, wherein the second circuit is further configured to perform a repair operation based at least in part on failing the address.

7. The apparatus of claim 1, wherein the second circuit is further configured to fail the address based at least in part on the indication stored in the mode register.

8. The apparatus of claim 1, wherein the test circuit is further configured to cause the apparatus to reset the indication after the second circuit of the test circuit has performed the test.

9. The apparatus of claim 1, wherein the mode register is further configured to store the indication based at least in part on a load mode register command.

10. A method, comprising:
  identifying a value of an indication of whether an address is forced to fail one or more tests applied to a memory device;
  storing the address of a memory array of the memory device based at least in part on identifying the value of the indication;
  receiving a command to perform a test on the memory array based at least in part on storing the address; and
  determining, as part of the test, that the address includes one or more errors based at least in part on the value of the indication and storing the address.

11. The method of claim 10, further comprising:
  transmitting a second command to perform a repair operation on the memory array based at least in part on determining that the address includes the one or more errors.

12. The method of claim 10, further comprising:
  receiving an activate command to store the address in a register of a test circuit of the memory device, wherein the address is stored in the register based at least in part on receiving the activate command; and
  refraining from activating an access line of the memory device based at least in part on receiving the activate command.

13. The method of claim 10, wherein receiving the command to perform the test on the memory array further comprises:
  identifying a second value of a second indication of whether the test is performed on the memory array.

14. The method of claim 13, wherein:
  the indication is stored in a first mode register; and
  the second indication is stored in a second mode register.

15. The method of claim 10, further comprising:
  transmitting a second indication to a test circuit indicating the test circuit is to perform the test on the memory array, the indication based at least in part on the value of the indication.

16. The method of claim 10, wherein the value of the indication is identified based at least in part on a load mode register command.

17. An apparatus, comprising:
  a memory array; and
  a controller coupled with the memory array and operable to cause the apparatus to:
    identify a value of an indication of whether an address is forced to fail one or more tests applied to the memory array;
    store the address of the memory array based at least in part on identifying the value of the indication;
    receive a command to perform a test on the memory array based at least in part on storing the address; and
    determine, as part of the test, that the address includes one or more errors based at least in part on the value of the indication and storing the address.

18. The apparatus of claim 17, further comprising:
  a test circuit configured to perform the one or more tests on the memory array, wherein the controller is further operable to cause the apparatus to:
    receive a load mode register command, wherein the value of the indication is identified based at least in part on receiving the load mode register command; and
    receive an activate command to store the address in a register of the test circuit, wherein the address is stored in the register based at least in part on receiving the activate command.

19. The apparatus of claim 17, wherein the controller is further operable to cause the apparatus to:
  identify a second value of a second indication of whether the test is performed on the memory array, wherein receiving the command to perform the test on the memory array is based at least in part on identifying the second value.

* * * * *